(12) United States Patent
Inoue et al.

(10) Patent No.: US 6,531,718 B2
(45) Date of Patent: Mar. 11, 2003

(54) SEMICONDUCTOR DEVICE (75) Inventors: Kaoru Inoue, Shiga (JP); Katsunori Nishii, Osaka (JP); Hiroyuki Masato, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/759,401

(22) Filed: Jan. 12, 2001

(65) Prior Publication Data

US 2001/0020700 A1 Sep. 13, 2001

(30) Foreign Application Priority Data

Jan. 13, 2000 (JP) ........................................ 2000-005093

(51) Int. Cl.[7] ........................... H01L 29/06; H01L 31/72
(52) U.S. Cl. ...................... 257/189; 257/190; 257/191; 257/192; 257/187; 257/20; 257/24
(58) Field of Search ................................. 257/191, 187, 257/189–192, 20, 24, 27

(56) References Cited

U.S. PATENT DOCUMENTS

| 5,192,987 A | * | 3/1993 | Khan et al. ............... 257/183.1 |
| 6,015,979 A | * | 1/2000 | Sugiura et al. ................ 257/86 |
| 6,064,082 A | | 5/2000 | Kawai et al. |
| 6,140,169 A | * | 10/2000 | Kawai et al. ................ 438/197 |
| 6,429,467 B1 | * | 8/2002 | Ando ........................ 257/194 |

FOREIGN PATENT DOCUMENTS

| JP | 11-274474 | | 10/1999 |
| JP | 2000-068497 | | 3/2000 |
| JP | 02000223697 A | * | 8/2000 |
| JP | 2000-277724 | | 10/2000 |
| JP | 02000294768 A | * | 10/2000 |
| JP | 2000-299325 | | 10/2000 |
| JP | 2001-102567 | | 4/2001 |

OTHER PUBLICATIONS

"Piezoelectric doping in AlInGaN/GaN heterostructures", by M. Asif Khan, et al., Applied Physics Letters, vol. 75, No. 18, Nov. 1, 1999, pp. 2806–2808.
Japanese Office Action dated Jul. 4, 2002.
Copy of Office Action dated 12/114/2000 issued in the corresponding Japanese application for this case.
"Measurement of Piezoelectrically Induced Charge in GaN/ AlGaN Heterostructure Field–Effect Transistors", by E.T. Yu, et al., Appl. Phys. Letters vol. 71, No. 19, pps. 2794–2796.
"Two–Channel AlGaN/GaN Heterostructure Field Effect Transistor for High Power Application", by R. Gaska, from Journal of Applied Physics, vol. 85, No. 5, pps. 3009–3011.

* cited by examiner

*Primary Examiner*—Eddie Lee
*Assistant Examiner*—Joseph Nguyen
(74) *Attorney, Agent, or Firm*—Snell & Wilmer, LLP (57) ABSTRACT

A semiconductor device includes: a substrate; a buffer layer including GaN formed on the substrate, wherein surfaces of the buffer layer are c facets of Ga atoms; a separating layer including $(In_XAl_{1-X})_YGa_{1-Y}N$ (where $0 \leq X \leq 1$, $0 \leq Y \leq 1$) formed on the buffer layer, wherein surfaces of the separating layer are c facets of In, Al, or Ga atoms; a channel layer including GaN, InGaN, or a combination of GaN and InGaN formed on the separating layer, wherein surfaces of the channel layer are c facets of Ga or In atoms; and an electron supply layer including AlGaN formed on the channel layer, wherein surfaces of the electron supply layer are c facets of Al or Ga atoms, wherein the AlN composition ratio in the separating layer is smaller than the AlN composition ratio in the electron supply layer.

8 Claims, 8 Drawing Sheets

PRIOR ART

FIG. 9

PRIOR ART

FIG. 10

PRIOR ART

*FIG.11*

PRIOR ART

SEMICONDUCTOR DEVICE

BACKGROUND OF THE INVENTION

1. Field of the Invention

The present invention relates to a semiconductor device, and more particularly to a semiconductor device such as a field-effect transistor (FET) having a heterostructure of gallium nitride-based semiconductor which is generally represented as $(In_XAl_{1-X})_YGa_{1-Y}N$ (where $0 \leq X \leq 1$, $0 \leq Y \leq 1$).

2. Description of the Related Art

A gallium nitride-based semiconductor such as GaN, AlGaN, InGaN, InAlGaN or the like has a high dielectric breakdown field, high thermal conductivity and a high electron saturation velocity, and thus is promising as a material for a high-frequency power device. Particularly in a semiconductor device having an AlGaN/GaN heterojunction structure, electrons accumulate with high density in the close vicinity of a heterojunction interface between AlGaN and GaN, and a so-called two-dimensional electron gas is formed. This two-dimensional electron gas exists in a spatially separated state from donor impurities added to AlGaN, and thus shows high electron mobility. A field-effect transistor having such a heterostructure is produced so that a source resistance can be reduced. Moreover, a distance d from a gate electrode to the two-dimensional electron gas is typically as short as tens of nanometers, and thus, even if a gate length Lg is as short as about 100 nm, the ratio of the gate length Lg to the distance d (i.e., aspect ratio) Lg/d, can be increased from 5 to about 10. Accordingly, semiconductor devices having an AlGaN/GaN heterostructure have a superior feature in that a field-effect transistor which has an insignificant short-channel effect and satisfactory saturation property can be readily produced. Moreover, a two-dimensional electron of the AlGaN/GaN-based heterostructure has an electron velocity in a high field region of about $1 \times 10^5$ V/cm, which is twice or more than the electron velocity in AlGaAs/InGaAs-based heterostructure currently prevalent as a high-frequency transistor, and thus, is expected to be applied to high-frequency power devices.

Figure 8:
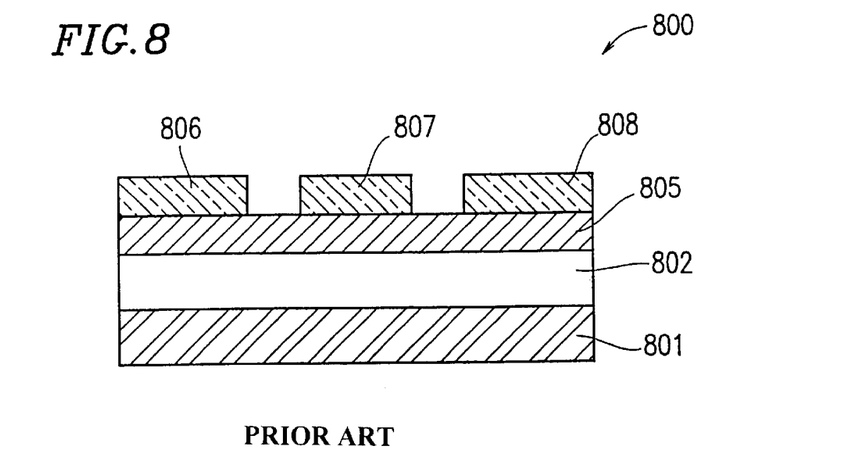
FIG. 8 is a cross-sectional view of a conventional GaN-based FET.

FIG. 8 shows an exemplary cross-sectional view of a conventional FET 800 having an AlGaN/GaN-based heterostructure. The AlGaN/GaN-based heterostructure of the FET 800 is typically formed on a substrate 801 composed of a [0001] facet (c facet), through a crystal growth process using a metal-organic chemical vapor deposition method or a molecular beam epitaxy method. Typically, a sapphire substrate or SiC substrate is used as the substrate 801. In the FET 800, a buffer layer 802 including GaN and an electron supply layer 805 including AlGaN are sequentially provided on the sapphire or SiC substrate 801. On the electron supply layer 805, a source electrode 806, a gate electrode 807, and a drain electrode 808 are provided separately from one another. In the case of forming the buffer layer 802 including GaN on the sapphire or SiC substrate 801, it is necessary to thickly form the buffer layer 802 in order to account for a great lattice constant difference between the substrate 801 and the buffer layer 802. This is because the strain due to a lattice mismatch between the buffer layer 802 and the substrate 801 is sufficiently relaxed by forming the buffer layer 802 so as to have a relatively large thickness. By forming the electron supply layer 805 containing AlGaN to which n-type impurities, such as Si or the like, are added so as to have a thickness on the order of tens of nanometers on the thick buffer layer 802, a two-dimensional electron gas (i.e., electron channel) is formed in the buffer layer 802 which has a great electron affinity in the heterointerface between the buffer layer 802 and the electron supply layer 805 (i.e., between AlGaN and GaN) due to the effects of selective doping. The crystal facet of a heterostructure formed by an MOCVD (Metal-Organic Chemical Vapor Deposition) method, is typically composed of a facet of Ga, which is a group III element. This two-dimensional electron gas is susceptible to the effects of piezo-polarization in a c axis direction due to tensile stress imposed on AlGaN, in addition to a difference in spontaneous polarization between AlGaN (included in the electron supply layer 805) and GaN (included in the buffer layer 802). Thus, electrons accumulate at a density which is higher than a value which would be expected from the density of the n-type impurities added to the electron supply layer 805. When the Al composition of AlGaN of the electron supply layer 805 is 0.2 to 0.3 with respect to AlGaN, electron density of the channel layer formed in the buffer layer 802 is about $1 \times 10^{13}/cm^2$, which is about 3 times the density of a GaAs-based device. Since the two-dimensional electron gas at such a high density is accumulated, the semiconductor device 800 used as a GaN-based heterostructure field-effect transistor (FET) is considered as a highly promising power device.

However, such a conventional FET 800 has several disadvantages. The first of which is that due to the immaturity of crystal growth techniques, a crystal with satisfactory quality cannot be obtained.

One of the problems related to the crystal growth is associated with the fact that the undoped GaN included in the buffer layer 802 typically is an n-type and the carrier density may be as high as about $10^{16}/cm^3$ or more. This is presumably because constituent nitrogen (N) atoms are released during crystal growth, and thus, vacancies are liable to be formed. When there are such residual carriers, the leakage current component via the buffer layer 802 of the device becomes greater. In particular, when operating the device at a high temperature, deteriorations in the element properties, such as aggravation of pinch-off characteristics, may occur. As for an isolation problem, when forming a plurality of GaN-based heterostructure FETs on the same substrate, the FETs interfere with each other, hindering normal operation. When the gate electrode 807 is further provided above this buffer layer 802, a problem such as an increase of a gate leakage current, or the like, may arise.

Figure 9:
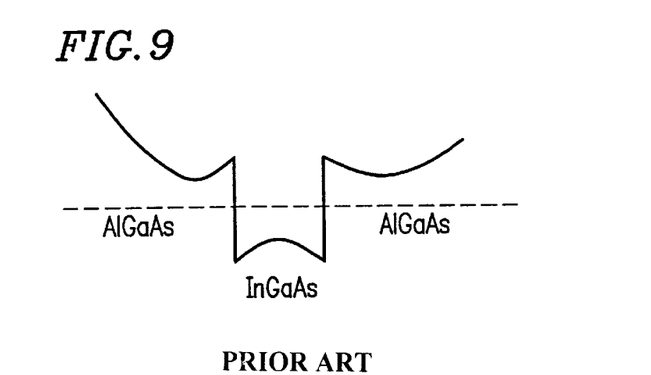
FIG. 9 is a potential map showing a distribution of potential energy along a depth direction of a conventional double-doped, double heterostructure.

The second disadvantage of a conventional FET 800 is ascribed to the effects of polarization as described above. In a conventional FET having an AlGaAs/InGaAs-based heterostructure, a channel layer is composed of InGaAs, and an electron (carrier) supply layer is composed of AlGaAs and is doped with Si. In general, when such a FET is applied as a power device, an AlGaAs/InGaAs/AlGaAs structure, in which an InGaAs (channel) layer is sandwiched by two n-type AlGaAs layers, is employed. In this structure, the electron density of the channel layer is about 2 times the electron density of a channel layer in a non-sandwich type structure. FIG. 9 schematically shows a distribution of the potential energy of conduction band along the depth direction of such a semiconductor device. As shown in FIG. 9, electrons are supplied from the AlGaAs layers to the InGaAs layer whose potential is lower than those of the AlGaAs layers. Such a structure which has two Si-doped AlGaAs layers is called a double-doped structure or a double-doped, double-heterostructure.

Figure 10:
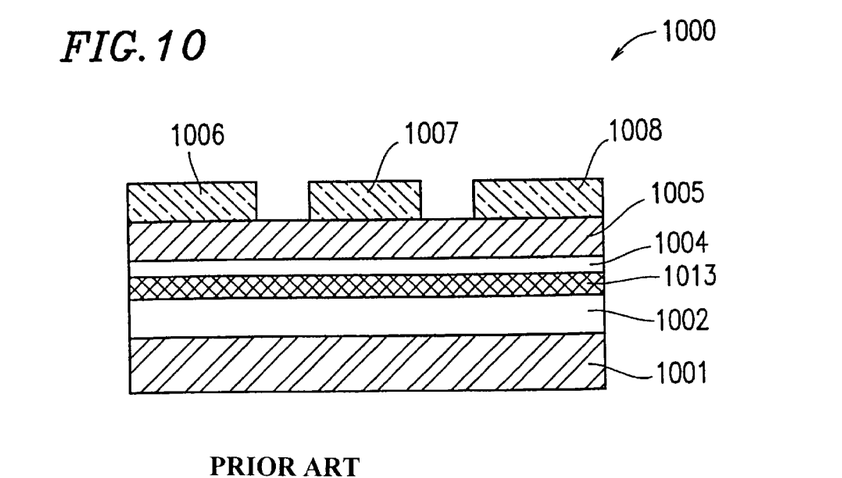
FIG. 10 is a cross-sectional view of a conventional GaN-based double-doped, double heterostructure.
Figure 11:
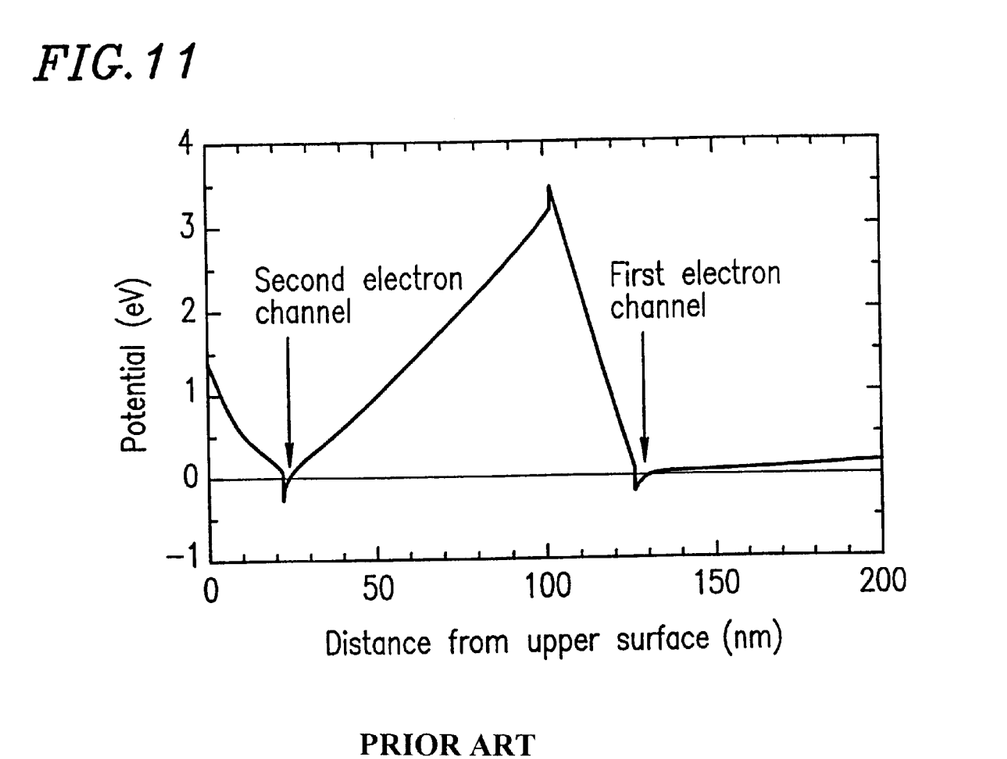
FIG. 11 is a potential map showing a distribution of potential energy along a depth direction of the conventional GaN-based double-doped, double heterostructure.

FIG. 10 shows a structure of an n-type AlGaN/GaN/n-type AlGaN device 1000, which is a GaN-based device having a double-doped structure. FIG. 11 shows a distribution of the potential energy along the depth direction in the semiconductor device 1000.

The conventional FET 1000 shown in FIG. 10 sequentially includes the following layers on a sapphire or SiC substrate 1001: a first channel layer 1002, including GaN; a first electron supply layer 1013, including AlGaN; a second channel layer 1004, including GaN; and a second electron supply layer 1005, including AlGaN. On the second electron supply layer 1005, a source electrode 1006, a gate electrode 1007 and a drain electrode 1008 are provided separately from one another. In the GaN-based double-doped structure shown in FIG. 10, doping is performed only on the second electron supply layer 1005 because a large polarization influence is caused on electrons which are supplied from the first and second electron supply layers 1013 and 1005 to the first and second channel layers 1002 and 1004, respectively.

As seen from the graph of FIG. 11, in a GaN-based semiconductor device, the potential in a heterointerface between the second channel layer 1004 and the first electron supply layer 1013 is significantly increased due to piezopolarization or spontaneous polarization. As a result, electrons accumulate in two separate regions. That is, a first (lower) electron channel is formed by electrons which have accumulated in the first channel layer 1002 in the close vicinity of a heterointerface with the first electron supply layer 1013, and a second (upper) electron channel is formed by electrons which have accumulated in the second channel layer 1004 in the close vicinity of a heterointerface with the second electron supply layer 1005. Currents flow through these electron channels. The distance between the first and second electron channels is about several tens of nanometers. With such a great distance, the mutual conductance of the conventional FET 1000 is small as compared with an AlGaAs/InGaAs/AlGaAs structure in which electrons accumulate so as to form a single electron channel. As a result, the gain of the conventional FET 1000 is decreased, which is undesirable in view of high frequency operation.

SUMMARY OF THE INVENTION

According to one aspect of the present invention, a semiconductor device includes: a substrate; a buffer layer including GaN formed on the substrate, wherein surfaces of the buffer layer are c facets of Ga atoms; a separating layer including $(In_X Al_{1-X})_Y Ga_{1-Y}N$ (where $0 \leq X \leq 1$, $0 \leq Y \leq 1$) formed on the buffer layer, wherein surfaces of the separating layer are c facets of In, Al, or Ga atoms; a channel layer including GaN, InGaN, or a combination of GaN and InGaN formed on the separating layer, wherein surfaces of the channel layer are c facets of Ga or In atoms; and an electron supply layer including AlGaN formed on the channel layer, wherein surfaces of the electron supply layer are c facets of Al or Ga atoms, wherein the AlN composition ratio in the separating layer is smaller than the AlN composition ratio in the electron supply layer.

In one embodiment of the present invention, in the separating layer including $(In_X Al_{1-X})_Y Ga_{1-Y}N$, X=0.

In another embodiment of the present invention, the AlN composition ratio in the separating layer is equal to or smaller than about 0.1.

Instill another embodiment of the present invention, the AlN composition ratio in the separating layer gradually increases from an interface with the buffer layer to an interface with the electron supply layer.

According to another aspect of the present invention, a semiconductor device includes: a substrate; a buffer layer including GaN formed on the substrate, wherein surfaces of the buffer layer are c facets of Ga atoms; a first electron supply layer including $(In_X Al_{1-X})_Y Ga_{1-Y}N$ (where $0 \leq X \leq 1$, $0 \leq Y \leq 1$) formed on the buffer layer, wherein surfaces of the first electron supply layer are c facets of In, Al, or Ga atoms; a channel layer including GaN, InGaN, or a combination of GaN and InGaN formed on the first electron supply layer, wherein surfaces of the channel layer are c facets of Ga or In atoms; and a second electron supply layer including AlGaN formed on the channel layer, wherein surfaces of the electron supply layer are c facets of Al or Ga atoms, wherein the AlN composition ratio, the InN composition ratio, and the GaN composition ratio in the first electron supply layer are set such that electrons accumulate in a vicinity of a heterointerface between the first electron supply layer and the channel layer due to a variation in polarization.

According to still another aspect of the present invention, a semiconductor device includes: a substrate; a buffer layer including GaN formed on the substrate, wherein surfaces of the buffer layer are c facets of N atoms; a first electron supply layer including AlGaN formed on the buffer layer, wherein surfaces of the first electron supply layer are c facets of N atoms; a channel layer including GaN, InGaN, or a combination of GaN and InGaN formed on the first electron supply layer, wherein surfaces of the channel layer are c facets of N atoms; and a second electron supply layer including $(In_X Al_{1-X})_Y Ga_{1-Y}N$ (where $0 \leq X \leq 1$, $0 \leq Y \leq 1$) formed on the channel layer, wherein surfaces of the electron supply layer are c facets of N atoms, wherein the AlN composition ratio, the InN composition ratio, and the GaN composition ratio in the first electron supply layer are set such that electrons accumulate in a vicinity of a heterointerface between the second electron supply layer and the channel layer due to a variation in polarization.

Thus, the invention described herein makes possible the advantages of: (1) providing a semiconductor device in which a leakage current between a source and a drain, a gate leakage current, and a leakage current between devices caused by residual carriers caused in a GaN layer (channel layer) are significantly reduced; and (2) providing a semiconductor device having a double-doped, GaN-based heterostructure in which electrons can accumulate so as to form a single electron channel and which provides a superior mutual conductance and a high current driving performance.

These and other advantages of the present invention will become apparent to those skilled in the art upon reading and understanding the following detailed description with reference to the accompanying figures.

DESCRIPTION OF THE PREFERRED EMBODIMENTS

In the description hereinbelow, a field-effect transistor (FET) is taken as an example of the present invention. However, the present invention is not limited to a field-effect transistor. The present invention can be applied to any semiconductor device having a heterostructure of a gallium nitride-based semiconductor which is generally represented as $(In_XAl_{1-X})_YGa_{1-Y}N$ (where $0 \leq X \leq 1$, $0 \leq Y \leq 1$).

As described above with reference to FIG. 10, in a structure including the first channel layer 1002, the first electron supply layer 1013, the second channel layer 1004, and the second electron supply layer 1005, two separated electron channels are formed. In such a structure, a large number of electrons accumulate in both of these two regions, but electrons in the lower electron channel do not largely contribute to an increase in drain current. These electrons increase the gate capacitance of the FET, but deteriorate the performance of the FET as a whole. However, in such a structure, increase in potential level at the heterointerface between the first electron supply layer 1013 composed of AlGaN and the second channel layer 1004 composed of GaN contributes to the confinement of electrons originally present in the upper portion of the semiconductor device into an upper (second) electron channel. With such an electron confinement effect, the drain conductance of the FET is decreased, whereby the power gain of the FET is increased. Furthermore, in such a FET, the gate length can be easily decreased, and accordingly, the operation frequency can be increased.

A semiconductor device according to one embodiment of the present invention has substantially the same structure as that shown in FIG. 10, except that a layer corresponding to the second electron supply layer 1005 shown in FIG. 10 (hereinafter, referred to as a "separating layer") is formed so as to have a thickness greater than that of the second electron supply layer 1005, and that the AlN composition ratio in the separating layer is set to be much smaller than the AlN composition ratio in an electron supply layer (corresponding to the first electron supply layer 1013). In the semiconductor device having such a structure, electrons are prevented from accumulating in the close vicinity of a heterointerface between the separating layer and a buffer layer (corresponding to the second channel layer 1004), while the increase in potential level at the heterointerface contributes to the confinement of electrons.

In a semiconductor device according to another embodiment of the present invention, a first electron supply layer is not composed of AlGaN, but of $(In_XAl_{1-X})_YGa_{1-Y}N$. With such a material, at the heterointerface between the first electron supply layer and the buffer layer, the sign (+/−) of the peak potential level is opposite to that seen in the case where AlGaN is used for the separating layer. In such a semiconductor device, an electron channel is formed only in the channel layer, while an electron channel is not formed in the buffer layer. As a result, a potential distribution similar to that seen in a selectively-doped, AlGaAs/InGaAs/AlGaAs double heterostructure can be obtained. That is, by setting X and Y in $(In_XAl_{1-X})_YGa_{1-Y}N$ to appropriate values, electrons in the first electron supply layer can be supplied to the electron channel in the channel layer. In the case where such a structure is employed, for the purpose of substantially obtaining a single electron channel, it is necessary to set the thickness of the channel layer (which is formed of GaN, InGaN, or a combination of GaN and InGaN over the $(In_XAl_{1-X})_YGa_{1-Y}N$ layer) from about 10 nm to about 20 nm.

(Embodiment 1)

Figure 1A:
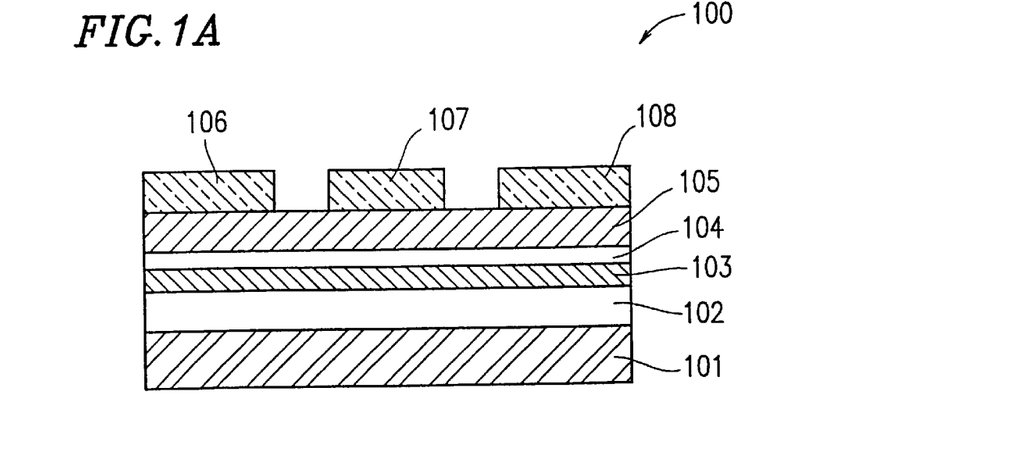
FIG. 1A is a cross-sectional view of a field-effect transistor (FET) which is a semiconductor device according to embodiment 1 of the present invention.
Figure 1B:
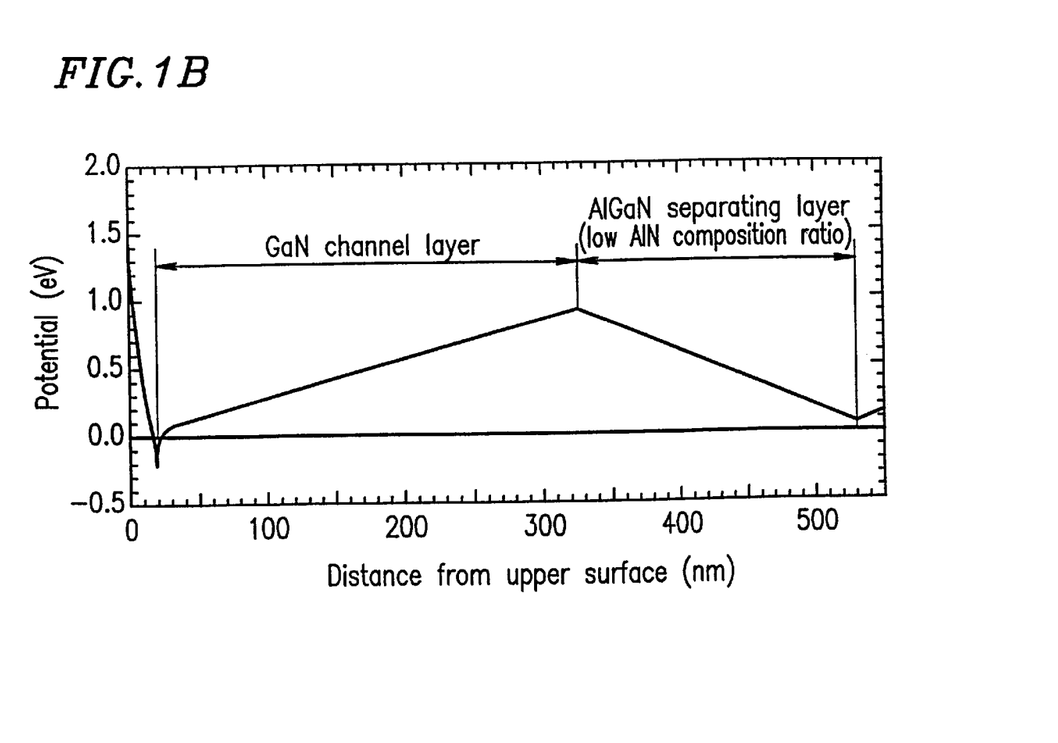
FIG. 1B is a potential map showing a distribution of potential energy along a depth direction of the FET shown in FIG. 1A.

A semiconductor device according to embodiment 1 of the present invention is described with reference to the drawings. FIG. 1A is a cross-sectional view of a FET 100 according to embodiment 1 of the present invention. FIG. 1B shows a distribution of potential energy along a depth direction of the FET 100 when the gate voltage is 0 V.

The FET 100 includes on a substrate 101 a buffer layer 102, a separating layer 103, a channel layer 104, and an electron supply layer 105. On the electron supply layer 105, a source electrode 106, a gate electrode 107, and a drain electrode 108 are provided separately from one another.

The FET 100 is formed, for example, as described below. On a sapphire substrate 101, a GaN layer (thickness: about 20 nm) and an undoped GaN layer (thickness: about 2 $\mu$m) are sequentially grown by using a MOCVD method. These GaN layers form a buffer layer 102. Then, on the buffer layer 102, an AlGaN separating layer 103 (thickness: about 50 nm to about 300 nm) is formed such that the composition ratio of AlN with respect to AlGaN in the separating layer 103 is about 0.1 or less (and is of course greater than 0), preferably from about 0.01 to about 0.05. On the separating layer 103, a GaN channel layer 104 (thickness: about 300 nm to about 500 nm) is formed. On the channel layer 104, an n-type AlGaN electron supply layer 105 doped with Si (thickness: about 20 nm) is formed, in which the carrier density is, for example, about $2 \times 10^{18}$ cm$^{-3}$. The surfaces (interfaces) of these layers are composed of a group III element.

FIG. 1B shows a potential profile of a semiconductor device having the structure shown in FIG. 1A, in which the separating layer 103 has a thickness of about 200 nm and has an AlN composition ratio of 0.01; the channel layer 104 has a thickness of about 300 nm; and the electron supply layer 105 has a thickness of about 20 nm. In this case, a depletion layer which is formed by the separating layer 103 and the channel layer 104 has a thickness of about 500 nm, and the peak value of the potential is 1 eV as seen from FIG. 1B. The potential at a heterointerface on the substrate side (i.e., the interface between the separating layer 103 and the buffer layer 102) is higher than the Fermi level (at which the potential is 0 eV). The electron density at this heterointerface is sufficiently low, e.g., on the order of $10^{11}$/cm$^2$. Furthermore, the heterointerface at the substrate side is completely separated from the heterointerface at the upper side (closer to the upper surface of the FET 100) by the thick depletion layer.

Such a FET structure is different from the structure of the conventional FET 800 (FIG. 8) in that the above FET structure includes an AlGaN separating layer 103 whose AlN composition ratio is low. With this separating layer 103, the carrier density and its temperature dependency significantly improve.

Figure 2:
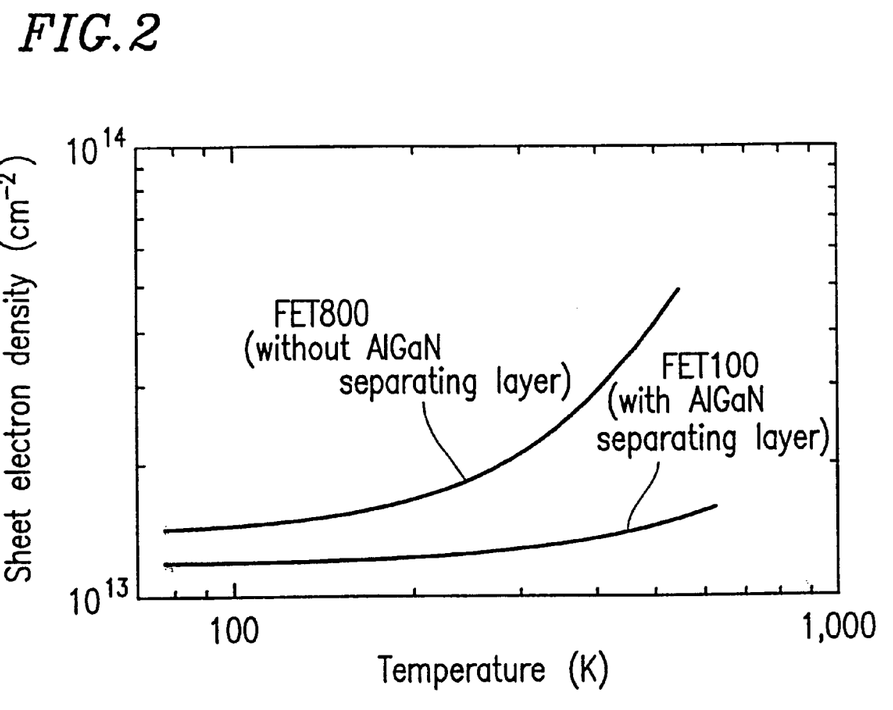
FIG. 2 shows a temperature characteristic of the sheet electron density for the FET according to embodiment 1 of the present invention and for a conventional FET.

FIG. 2 shows the variation of sheet electron density with temperature for the FET 800 which has a conventional heterostructure including a GaN buffer layer, and for the FET 100 in which an AlGaN separating layer 103 with a low AlN composition ratio is provided over the buffer layer 102. The sheet electron density in the FET 100 was measured by a hole measurement method. As seen from FIG. 2, in the FET 100 according to embodiment 1 of the present invention, the electron density is substantially constant in a range from about 77 K to room temperature, although it slightly increases in a higher temperature range. It is recognized that this constant electron density corresponds to the density of a two-dimensional electron gas accumulated in the close vicinity of a heterointerface between the electron supply layer 105 and the channel layer 104. On the other hand, in the conventional FET 800 which does not have an AlGaN separating layer 103 with a low AlN composition ratio, the electron density is high, and its temperature dependency is large. In the FET 800, it is recognized that the increase in electron density along with the increase in temperature is ascribed to the ionization of donors in the GaN buffer layer 802. In the FET 800 not having the AlGaN separating layer 103 with a low AlN composition ratio, the measured electron density is the electron density in the entire buffer layer 802, whereas in the structure of the FET 100, the influence of an ohmic electrode is blocked by the AlGaN separating layer 103 with a low AlN composition ratio (which is a depletion layer having a high resistance), whereby the generation of ions in the buffer layer 102 is suppressed. Therefore, the measured electron density does not include the electron density in the buffer layer 102 under the separating layer 103.

Figure 3A:
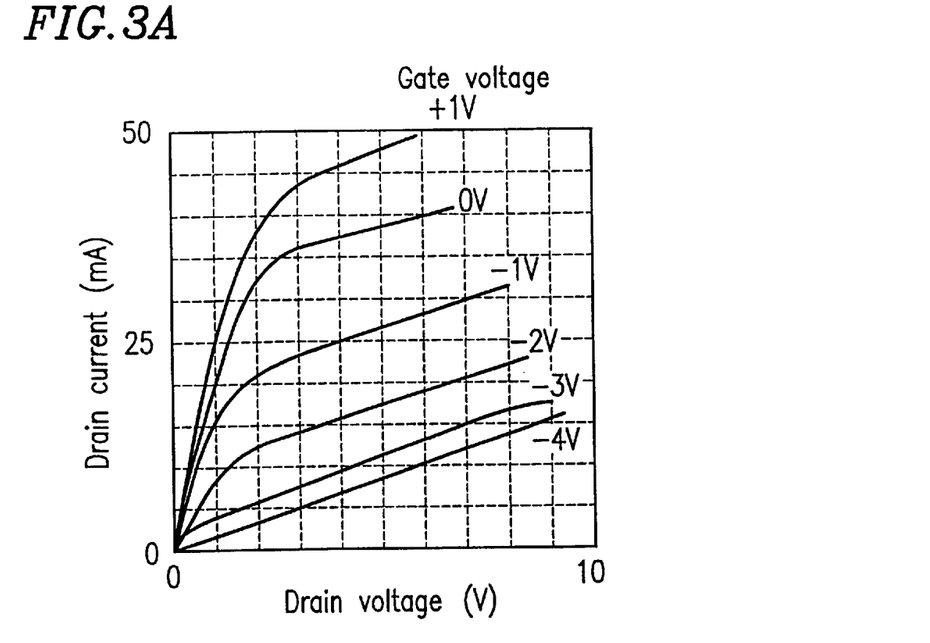
FIG. 3A shows a drain voltage-current characteristic of a conventional heterostructure FET.
Figure 3B:
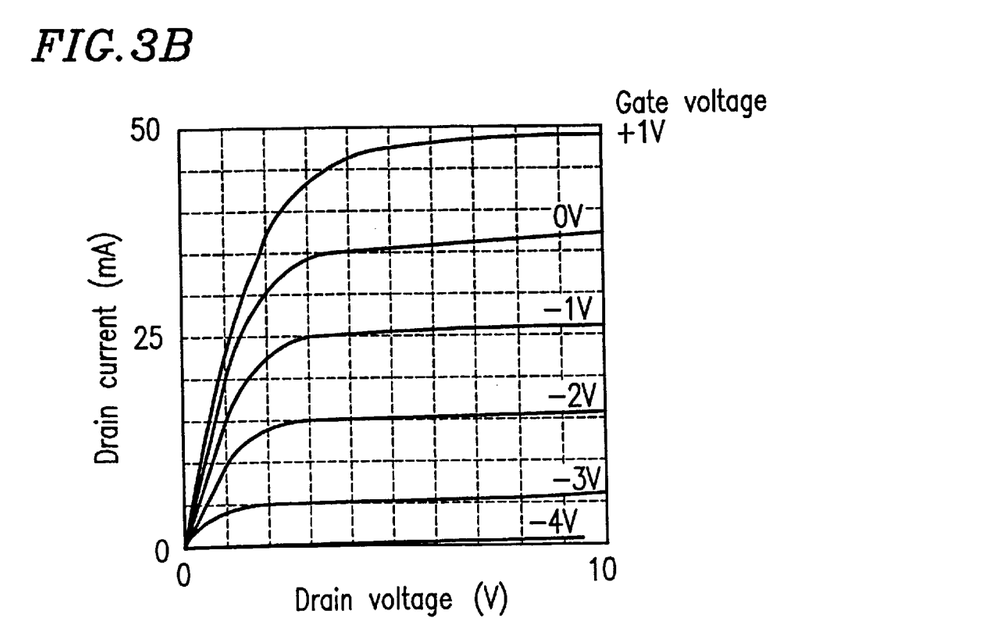
FIG. 3B shows a drain voltage-current characteristic of the FET according to embodiment 1 of the present invention.

FIGS. 3A and 3B show typical static characteristics of the conventional FET 800 and the FET 100 according to embodiment 1 of the present invention, respectively. As seen from FIG. 3B, the FET 100 has satisfactory pinch-off characteristics, so that drain current is not generated at a gate voltage of about −4 V. On the other hand, in the FET 800, as seen from FIG. 3A, the drain current is not blocked, and this current flows as a leakage current. In the case where an integrated circuit is formed on a single board by a plurality of such devices, each of which generating a large leakage current, adjacent devices interfere with one another, resulting in abnormal operation. Furthermore, the amount of ineffective current components increases, whereby the efficiency of the power device and high frequency operation are deteriorated.

As described above, the FET 100 according to embodiment 1 of the present invention includes between the buffer layer 102 and the channel layer 104 the separating layer 103 composed of AlGaN having a low AlN composition ratio. In such a structure, increase in a leakage current between a source and a drain, increase in a gate leakage current, and increase in current leakage between devices, due to residual carriers which may be caused in the buffer layer 102, are effectively suppressed. As a result, the suppressed increase of leakage currents contribute to the improvement in characteristics of a high frequency power device and to the prevention of abnormal operation in an integrated circuit made of a high frequency power device(s).

Now, the details of the separating layer 103 are described. Some conventional devices includes a thin film of AlGaN like the separating layer 103, but the function thereof is different from that of the separating layer 103. The exemplary conventional semiconductor device shown in FIG. 10 also includes an AlGaN thin film, but the AlN composition ratio and the location thereof in the layered structure are completely different from those of the separating layer 103 in the FET 100 of the present invention.

R. Gaska, et al., "Two-channel AlGaN/GaN heterostructure field effect transistor for high power applications" (Journal of Applied Physics vol. 85 (1999) pp. 3009–3011) describes a double-channel heterostructure FET having a structure similar to that of the FET according to the present invention. This FET includes a sapphire substrate and the following layers sequentially provided thereon: a first AlGaN layer (thickness: 50 nm); a GaN layer (thickness: 800 nm); a second AlGaN layer (thickness: 25 nm); a GaN channel layer (thickness: 100 nm); and an AlGaN barrier layer (thickness: 30 nm). The second AlGaN layer in this layered structure may appear to correspond to the AlGaN separating layer and to have the same function as that of the AlGaN separating layer of the present invention. However, as the title of the paper states, Gaska et al's purpose is to make two electron channels in the FET, and for this purpose, the GaN channel layer is formed so as to be as thin as 100 nm. Accordingly, the distance between the upper surface of the FET and the lower electron channel is as short as 150 nm. Furthermore, in this FET, the AlGaN composition ratio in the second AlGaN layer is the same as that in the AlGaN barrier layer, and therefore, this second AlGaN layer cannot be made thick. This is because the thickness of the second AlGaN layer is limited by its critical thickness which is imposed due to a lattice mismatch with the GaN channel layer, and also because if the second AlGaN layer is thick, the potential excessively increases in a heterointerface between the second AlGaN layer and the GaN channel layer, and accordingly, holes accumulate in this heterointerface. In the case where the hole density becomes relatively high, the variation of hole density (which depends on the variation of gate voltage) increases, and accordingly, the gate capacitance which depends on the hole density may be increased to a non-negligible level. As a result, the high frequency characteristic of the FET is deteriorated. In order to improve the high frequency characteristic, it is important to prevent the accumulation of holes or to provide a sufficient distance between the upper surface of the FET and a region in which holes accumulate so that the variation of electric charge caused by the variation of gate voltage or drain voltage is decreased as much as possible.

The first feature of the FET according to embodiment 1 of the present invention is that the AlN composition ratio of the AlGaN separating layer 103 is sufficiently lower than that of the AlGaN electron supply layer 105, so that electrons are prevented from accumulating in the close vicinity of a heterointerface between the separating layer 103 and the buffer layer 102. The second feature of the FET according to embodiment 1 of the present invention is that the thickness of the separating layer 103 is large, whereby a desirable potential level is obtained in the heterointerface. The third feature of the FET according to embodiment 1 of the present invention is that the sufficient distance is provided between the upper surface of the FET and the separating layer 103, so that only a single electron channel is formed in the FET. In such a structure, it is important to appropriately determine the thickness of the channel layer 104 (i.e., to make sure that the thickness of the channel layer 104 is not much greater than the appropriate thickness).

Now, an appropriate thickness of the channel layer 104 is approximately estimated. The tolerance of an excessive carrier density which is defined by the density of donors unintentionally caused in the channel layer 104 is considered to be a about 1/50 to about 1/100 or less of the saturated two-dimensional electron gas density. In such a case, the sheet carrier density is about $1\times10^{11}/cm^2$ to about $3\times10^{11}/cm^2$. Assuming that the residual donor density is about $1\times10^{16}/cm^3$, and setting the peak potential to about 2 eV in view of the GaN bandgap of about 3.2 eV, the thickness of the depleted GaN channel layer 104 is about 460 nm. Assuming that the residual donor density is about $5\times10^{16}/cm^3$, the thickness of the GaN channel layer 104 is about 205 nm. Taking account of the typical thickness of the channel layer (about 50 nm to about 100 nm), it is recognized that an appropriate thickness of the channel layer 104 is about 250 nm to about 560 nm.

In view of the above, the appropriate thickness of the GaN channel layer 104 is estimated to be about 300 nm to about 500 nm. This thickness is sufficiently greater than a typical depth to which an electrode metal material is inserted from the upper surface of the FET under the conditions for forming a common ohmic electrode (i.e., about 100 nm or less). In addition, since the AlGaN separating layer 103 having a low AlN composition ratio is provided under the channel layer 104, no current flows through the buffer layer 102. Moreover, the density of a two-dimensional electron gas accumulated in the close vicinity of the heterointerface between the separating layer 103 and the GaN buffer layer 102 is low. Therefore, the gate capacitance does not significantly increase, and the high frequency characteristic of the FET is not deteriorated.

(Embodiment 2)

A FET according to embodiment 2 of the present invention has substantially the same structure as that of the FET according to embodiment 1, except that a separating layer 103 is formed such that the AlN composition ratio thereof gradually increases along the thickness direction from the lower surface to the upper surface. Specifically, the separating layer 103 is formed so as to have a thickness of, e.g., about 100 nm to about 300 nm such that the AlN composition ratio gradually increases from about 0 to about 0.05 in a growth direction, i.e., from the lower surface to the upper surface thereof. The change rate of the AlN composition ratio is not limited to a particular rate as long as it is positive, i.e., the AlN composition ratio increasingly upwardly changes in a growth direction. In this way, the difference in composition at the heterointerface between the separating layer 103 and the buffer layer 102 is decreased. As a result, the density of electrons which accumulate in the close vicinity of this heterointerface is decreased, whereby the gate capacitance can be decreased.

(Embodiment 3)

Figure 4:
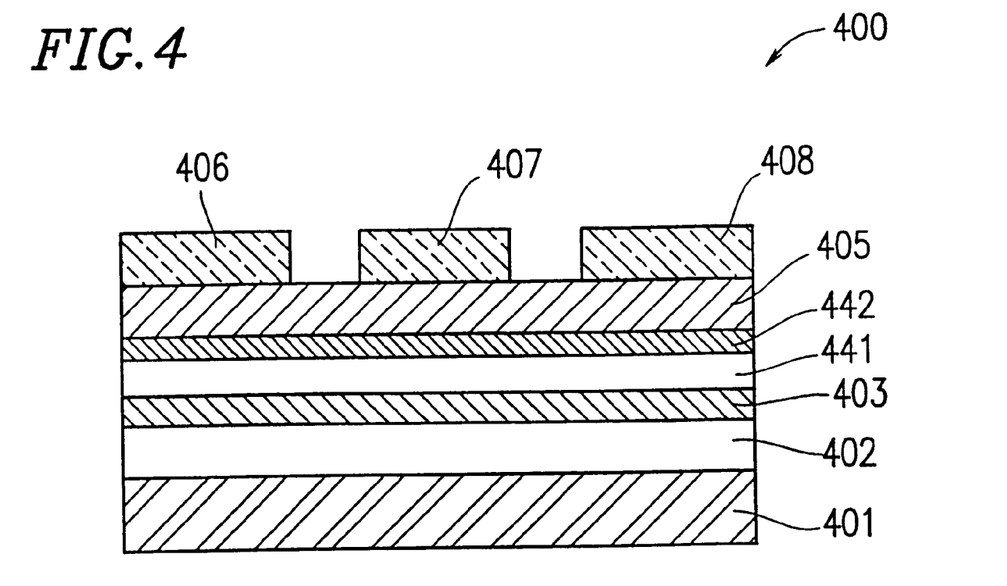
FIG. 4 is a cross-sectional view of a FET which is a semiconductor device according to embodiment 3 of the present invention.

A FET 400 according to embodiment 3 of the present invention is described with reference to FIG. 4.

The FET 400 sequentially includes the following layers on a substrate 401: a buffer layer 402; a separating layer 403; a first sub-channel layer 441; a second sub-channel layer 442; and an electron supply layer 405. On the electron supply layer 405, a source electrode 406, a gate electrode 407, and a drain electrode 408 are provided separately from one another.

The FET 400 includes two layers, the first sub-channel layer 441 composed of GaN and the second sub-channel layer 442 composed of InGaN, in place of the channel layer 104 of the FET 100. The structure of the FET 400 is achieved by providing an additional layer between the channel layer 104 and the electron supply layer 105 as the second sub-channel layer 442. The energy bandgap in the second sub-channel layer 442 is set to be smaller than in the first sub-channel layer 441 (corresponding to the channel layer 104), so that the electrons density in the electron channel is increased. As a result, electrons are confined in the second sub-channel layer 442, and accordingly, the gate length of the FET 400 can be easily decreased. The layered structure of the FET 400 is substantially the same as that of the FET 100, except for the inclusion of the InGaN second sub-channel layer 442. The InN composition ratio of the second sub-channel layer 442 with respect to InGaN is appropriately about 0.05 to about 0.2. The thickness of the second sub-channel layer 442 is appropriately about 10 nm to about 20 nm. The surfaces (interfaces) of these layers are composed of a group III element.

(Embodiment 4)

As described above with reference to FIG. 10, in a conventional structure in which a thin AlGaN layer 1013 is provided between the GaN layers 1002 and 1004, two electron channels are formed, and holes or electrons readily accumulate in the close vicinity of the heterointerface between the layers 1013 and 1004 and in the close vicinity of the heterointerface between the layers 1013 and 1002, respectively, due to the effects of spontaneous polarization and piezo-polarization. In addition, the two electron channels are widely separated by several tens of nanometers. As a result, pinch-off characteristics are not satisfactory, and the capacitance is additionally increased, whereby the high frequency characteristic is deteriorated. A FET according to embodiment 4 of the present invention includes a novel heterostructure for solving such problems, in which an $(In_XAl_{1-X})_YGa_{1-Y}N$ first electron supply layer is employed in place of the AlGaN first electron supply layer 1013.

Figure 5:
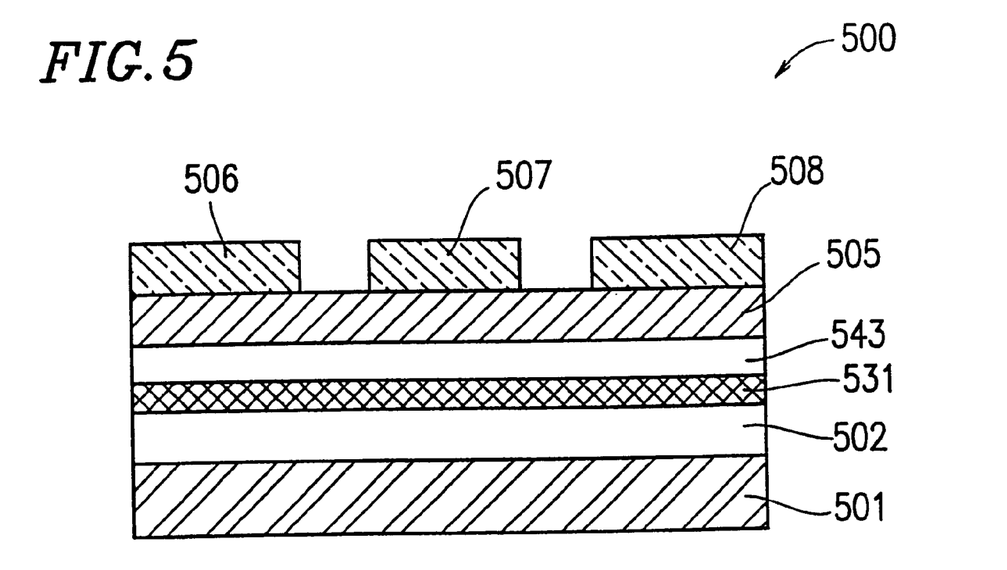
FIG. 5 is a cross-sectional view of a FET which is a semiconductor device according to embodiment 4 of the present invention.

An semiconductor device according to embodiment 4 of the present invention is described with reference to FIG. 5. FIG. 5 is a cross-sectional view of a FET 500 according to embodiment 4 of the present invention.

The FET 500 sequentially includes the following layers on a substrate 501: a buffer layer 502; a first electron supply layer 531; a channel layer 543; and a second electron supply layer 505. On the second electron supply layer 505, a source electrode 506, a gate electrode 507, and a drain electrode 508 are provided separately from one another.

The FET 500 is fabricated, for example, as follows. In the first step, a GaN buffer layer 502 (thickness: about 2 μm) is grown on a sapphire or SiC substrate 501 by using a MOCVD method. On the GaN buffer layer 502, a first electron supply layer 531 including $(In_XAl_{1-X})_YGa_{1-Y}N$ (thickness: about 10 nm to 30 nm) is grown. The $(In_XAl_{1-X})_YGa_{1-Y}N$ first electron supply layer 531 may be doped with n-type impurities such that the doping density is on the order of about $1\times10^{18}/cm^3$ to about $5\times10^{18}/cm^3$. The thickness of the first electron supply layer 531 is formed to be as thin as the critical thickness defined by a compression strain which is mainly imposed on this first electron supply layer 531.

On the first electron supply layer 531, a channel layer 543 is formed. The channel layer 543 may be formed solely as a GaN layer, solely as an InGaN layer, or as a combination of a GaN layer and an InGaN layer. However, it is important that in suppressing the decrease in the mutual conductance of the FET, the channel layer 543 is formed so as to be as thin as about 10 nm to about 30 nm. In the case where an InGaN layer is employed as the channel layer 543, the thickness thereof is appropriately set from about 10 nm to about 20 nm, and the InN composition ratio is appropriately set from about 0.05 to about 0.2. On the channel layer 543, a second electron supply layer 505 including n-type AlGaN is formed. The thickness thereof is appropriately set from about 10 nm to about 30 nm, the AlN composition ratio is appropriately set from about 0.15 to about 0.5, and the density of n-type impurity is appropriately set from about $1\times10^{13}/cm^3$ to about $5\times10^{18}/cm^3$. The surfaces (interfaces) of these layers are composed of a group III element.

Figure 6:
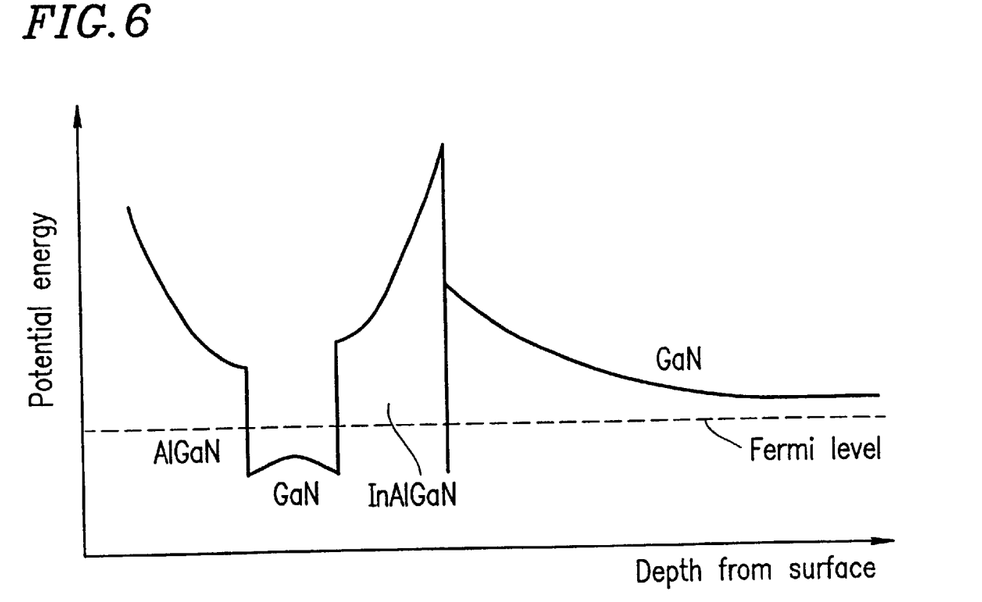
FIG. 6 is a potential map showing a distribution of a potential energy along a depth direction in the FET shown in FIG. 5.

FIG. 6 is a potential map showing a distribution of a potential energy along the depth direction in the above heterostructure of the FET 500 including a GaN layer as the channel layer 543. The FET 500 uses an $(In_XAl_{1-X})_YGa_{1-Y}N$ material for the first electron supply layer 531, whereby electrons are supplied to the channel layer 543 from both the $(In_XAl_{1-X})_YGa_{1-Y}N$ first electron supply layer 531 and the AlGaN second electron supply layer 505, and can be confined in the channel layer 543. As a result, a potential distribution similar to that obtained in the AlGaAs/InGaAs/AlGaAs structure shown in FIG. 9 is obtained. In this case, the electron density in the channel layer 543 is increased by about 50% or more as compared to a case where the $(In_XAl_{1-X})_YGa_{1-Y}N$ first electron supply layer 531 is not provided.

Thus, in the FET 500 according to embodiment 4 of the present invention, electrons are efficiently confined in the thin channel layer 543, while the electron density of the electron channel formed in the channel layer 543 can be significantly increased. As a result, a high-power GaN-based FET can be obtained. Moreover, since the drain conductance of the FET does not significantly deteriorate when the gate length is shortened, the high frequency characteristics can be readily improved.

Now, a consideration is given to how much electric charge is caused by the effects of polarization in a heterointerface between the GaN buffer layer 502 and an InAlN strain layer (an example of the first electron supply layer 531) formed thereon. Herein, it is assumed that no strain is caused in the GaN buffer layer 502, but a strain is caused only in the InAlN strain layer. In the heterointerface, an electric flux is subjected to the effects of polarization. The effects of polarization includes the effects resulting from difference of spontaneous polarization between the GaN buffer layer 502 and the InAlN strain layer, and the effects of piezo-polarization due to a strain caused in the InAlN strain layer. In the case of employing the theoretical values for the spontaneous polarizations of AlN, GaN, and InN, which are $-0.081$ C/m², $-0.029$ C/m², $-0.032$ C/m², respectively, (which are described in a document authored by F. Bernardini et al., in Physical Review vol. 56, pp. R10024-R10027 (1997)), the spontaneous polarization in $In_XAl_{1-X}N$ (where X represents the InN composition ratio) is approximated using a linear interpolation method with the following expression:

$$Psp(x)=-0.081+0.049x.$$

Therefore, the variation of spontaneous polarization in the heterointerface is:

$$Psp(x)-(-0.029)C/m^2.$$

On the other hand, the piezo-polarization in $In_XAl_{1-X}N$ is obtained using a strain $e_{xx}(x)$ due to the difference in lattice constant between $In_XAl_{1-X}N$ and GaN in view of the symmetry of a wurtzite crystal by the following expression:

$$Ppe(x)=2e_{xx}(x)\{e_{31}(x)-e_{33}(x)C_{13}(x)/C_{33}(x)\}$$

where $e_{31}(x)$ and $e_{33}(x)$ are piezoelectric constants for $In_XAl_{1-X}N$, and $C_{13}(x)$ and $C_{33}(x)$ are elastic constants for $In_XAl_{1-X}N$. These parameters are obtained as follows using a linear interpolation method with the theoretical values reported by F. Bernardini et al. and those given by A. F. Wright "Elastic properties of zinc-blende and wurzite AlN, GaN, and InN," Journal of Applied Physics vol. 82 pp. 2833–2839 (1997):

$$e_{31}(x)=-0.6+0.03x \text{ C/m}^2,$$

$$e_{33}(x)=1.46-0.49x \text{ C/m}^2,$$

$$C_{13}(x)=108-16x \text{ Gpa},$$

$$C_{33}(x)=1.46-0.49x \text{ Gpa},$$

$$e_{xx}(x)=(3.189-a(x))/a(x),$$

$$a(x)=3.112+0.428x.$$

Figure 7A:
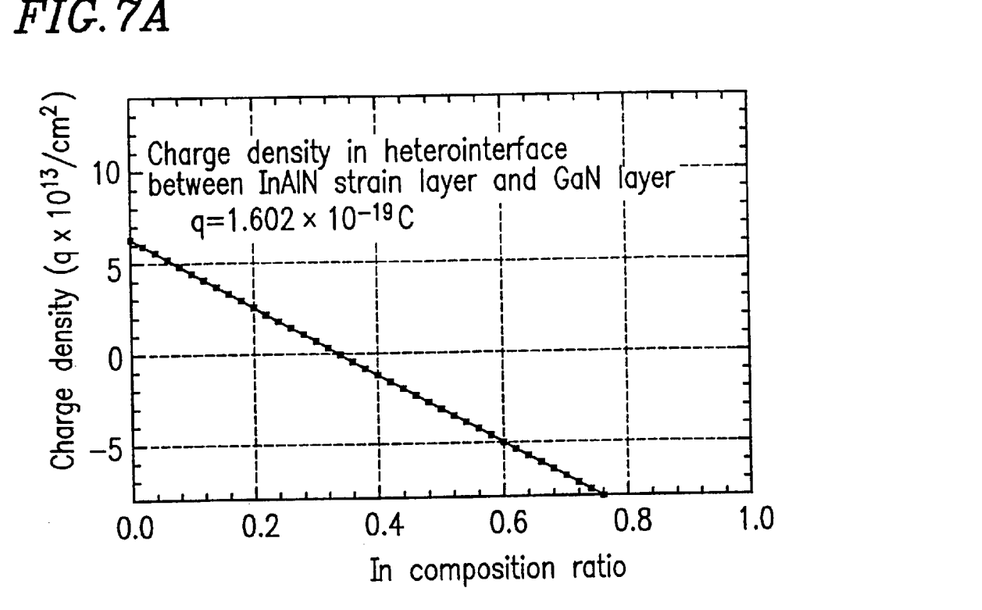
FIG. 7A shows the relationship between an In composition ratio in InAlN and a charge density in a heterostructure between InAlN and GaN.

The calculation result of the electric charge in the heterointerface with these values is shown in FIG. 7A. As seen from this graph, in the case where the InN composition ratio is about 0.3, the electric charge which may be caused in the heterointerface due to polarization is approximately zero, because substantially no change is caused in the polarization between $In_XAl_{1-X}N$ (the first electron supply layer 531) and GaN (the buffer layer 502). On the other hand, in the case where the InN composition ratio is about 0.4, a value of about $1.5\times10^{13}\times g/cm^2$ of negative electric charge (where q is the electric charge of one electron) is generated in the heterointerface. Accordingly, in the case where the layered structure is inversed, i.e., a GaN channel layer is formed on an $In_XAl_{1-X}N$ strain layer, a positive electric charge is generated in the heterointerface due to the effects of polarization. As a result, about $1.5\times10^{13}/cm^2$ electrons accumulate in the vicinity of the heterointerface in the GaN channel layer whose potential is lower than that of the $In_XAl_{1-X}N$ strain layer. Thus, in view of the above, the InN composition ratio in the $In_XAl_{1-X}N$ strain layer is only required to be about 0.3 or more. However, since electrons need to accumulate in the channel layer, and the energy bandgap of $In_XAl_{1-X}N$ needs to be greater than that of GaN, the upper limit of the InN composition ratio in the $In_XAl_{1-X}N$ strain layer is about 0.7.

Figure 7B:
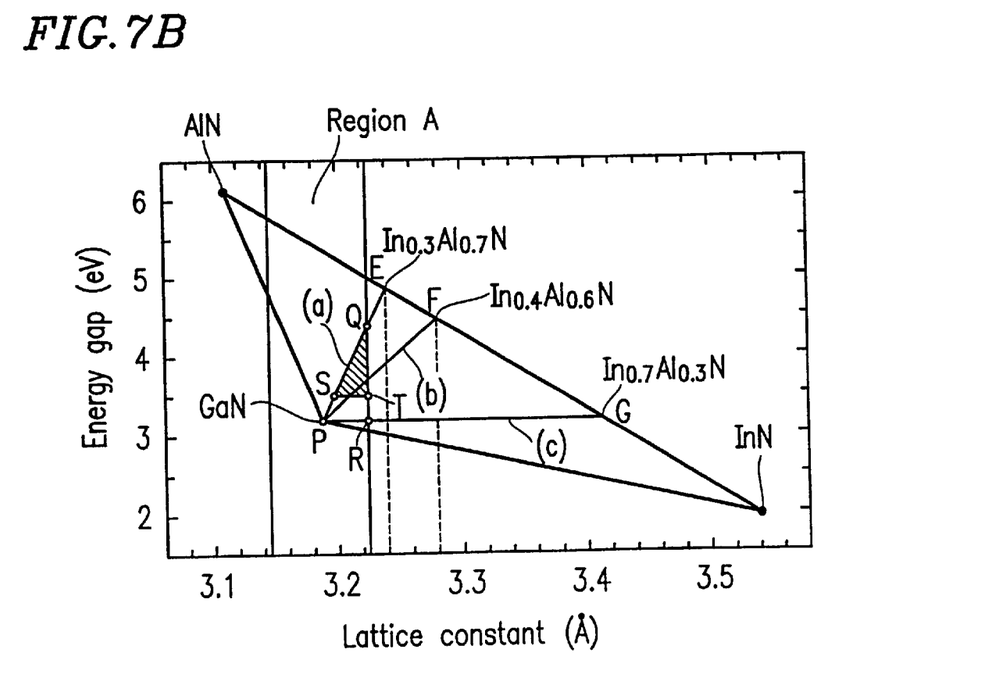
FIG. 7B is a graph showing the relationship between a lattice constant and an energy gap for describing a composition ratio of an InAlGaN mixed crystal which is suitable for a FET according to embodiment 4 of the present invention.

Values for X and Y in the $(In_XAl_{1-X})_YGa_{1-Y}N$ first electron supply layer 531 are determined as follows based on the above discussion. FIG. 7B shows a relationship between the lattice constant and the energy gap in an $(In_XAl_{1-X})_Y Ga_{1-Y}N$-based material. Line (a) connects point P corresponding to GaN and point E corresponding to $In_{0.3}Al_{0.7}N$. In theory, in the case where a layer is formed of a material corresponding to a point on line (a) on a GaN layer, there is little polarization caused therebetween. Line (b) connects point P corresponding to GaN and point F corresponding to $In_{0.4}Al_{0.6}N$. In theory, in the case where a layer is formed of a material corresponding to a point on line (b) on a GaN layer, about $1.5\times10^{13}/cm^2$ electrons accumulate in the vicinity of the heterointerface in the GaN layer due to the difference in potential which is caused by the effects of polarization. Line (c) connects point P corresponding to GaN and point G corresponding to $In_{0.7}Al_{0.3}N$, and represents the upper limit of X. A material corresponding to a point in Region A causes a lattice mismatch with GaN, but is sufficiently available for an electron device. The Region A ranges from about 3.14 Å to about 3.28 Å for the lattice constant. Thus, a material corresponding to a point in a triangular region designated by PQR can be used in a FET according to the present invention. However, in the case where a GaN material is used for the channel layer, it is necessary to provide a certain difference in the minimum energy of conduction-band between the channel layer and the first electron supply layer, and accordingly, a material corresponding to a point in a triangular region designated by SQT should be used in a FET according to the present invention. In either case, the range of X in the $(In_XAl_{1-X})_YGa_{1-Y}N$ first electron supply layer 531 is from about 0.3 to about 0.7. On the other hand, the range of Y in the $(In_XAl_{1-X})_YGa_{1-Y}N$ is appropriately about 0.15–0.6 when the channel layer 543 is made of GaN, and is appropriately about 0 to about 0.6 when the channel layer 543 is made of InGaN. In either case, it is preferable to select a material such that its lattice constant is about 0.323 nm or less according to the value of X.

(Embodiment 5)

In the semiconductor device according to embodiment 4, the crystal facet of each layer is composed of a group III element. In a semiconductor device according to embodiment 5, on the other hand, the crystal facet of each layer is composed of a group V element. When the crystal growth is performed under the condition that the crystal facet of each layer is composed of a group V element, the direction of polarization is opposite to that for the crystal facet of a group III element. Therefore, the layered structure should be the inverse of the layered structure in the semiconductor device according to embodiment 4, i.e., a layer corresponding to the second electron supply layer 505 (FIG. 5) is an $(In_XAl_{1-X})_YGa_{1-Y}N$ layer, and a layer corresponding to the first electron supply layer 531 (FIG. 5) is an AlGaN layer. As for the other details, the semiconductor device according to embodiment 5 is substantially the same as the semiconductor device according to embodiment 4. Values for X and Y may be determined in the same manner as described for embodiment 4. Advantages obtained from the device structure according to embodiment 5 are the same as those of the device structure according to embodiment 4.

In the above embodiments of the present invention, In can be contained in the AlGaN layer as long as the AlGaN layer is subjected to a tensile stress. That is, needless to say, a four-element mixed crystal, such as $(In_XAl_{1-X})_YGa_{1-Y}N$ (where $0 \leq X \leq 1$, $0 \leq Y \leq 1$), may be used for this layer.

In the above embodiments of the present invention, an AlN layer having a relatively thin thickness, such as about 100 nm, may be formed between the substrate and the buffer layer as in a conventional semiconductor device. Even in a case where such an AlN layer is formed, a semiconductor device according to the present invention can be used in essentially the same manner, and can provide the same effects as those of the semiconductor device not having such an AlN layer between the substrate and the buffer layer.

As described hereinabove, a semiconductor device according to one embodiment of the present invention includes an AlGaN separating layer having a low AlN composition ratio between a GaN channel layer and a GaN buffer layer. With such a structure, a leakage current between a source and a drain, a gate leakage current, and a leakage current between devices caused by residual carriers unintentionally caused in the GaN layers (channel layer) are significantly reduced, while electrons are efficiently confined in the channel layer, whereby the gate length can be easily decreased, and accordingly, device properties can be improved.

Another embodiment of the present invention provides a double-doped, GaN-based heterostructure FET having a novel structure in which electrons can accumulate so as to form a single electron channel. Such a structure provides a superior mutual conductance and a high current driving performance, and contributes to the improvement in power characteristics of a gallium nitride-based semiconductor device. Furthermore, with such a structure, the gate length can be easily decreased, and accordingly, the device properties can be improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device comprising:

a substrate;

a buffer layer including GaN formed on the substrate, wherein surfaces of the buffer layer are c facets of Ga atoms;

a first electron supply layer including InAlGaN formed on the buffer layer, wherein surfaces of the first electron supply layer are c facets of In, Al, or Ga atoms;

a channel layer including GaN, InGaN, or a combination of GaN and InGaN formed on the first electron supply layer, wherein surfaces of the channel layer are c facets of Ga or In atoms; and a second electron supply layer including AlGaN formed on the channel layer, wherein surfaces of the second electron supply layer are c facets of Al or Ga atoms;

wherein the AlN composition ratio, the InN composition ratio, and the GaN composition ratio in the first electron supply layer are set such that electrons accumulate in a vicinity of a heterointerface between the first electron supply layer and the channel layer due to a variation in polarization; and a single electron channel in the semiconductor device is provided by providing the InAlGaN first electron supply layer.

2. A semiconductor device comprising:

a substrate;

a buffer layer including GaN formed on the substrate, wherein surfaces of the buffer layer are c facets of N atoms;

a first electron supply layer including AlGaN formed on the buffer layer, wherein surfaces of the first electron supply layer are c facets of N atoms;

a channel layer including GaN, InGaN, or a combination of GaN and InGaN formed on the first electron supply layer, wherein surfaces of the channel layer are c facets of N atoms; and a second electron supply layer including InAlGaN formed on the channel layer, wherein surfaces of the second electron supply layer are c facets of N atoms;

wherein the AlN composition ratio, the InN composition ratio, and the GaN composition ratio in the first electron supply layer are set such that electrons accumulate in a vicinity of a heterointerface between the second electron supply layer and the channel layer due to a variation in polarization; and a single electron channel in the semiconductor device is provided by providing the InAlGaN second electron supply layer.

3. A semiconductor device according to claim 1, wherein the InAlGaN first electron supply layer has a composition of $(In_xAl_{1-x})_yGa_{1-y}N$, where X is from about 0.3 to about 0.7, and $0 \leq Y - 1$.

4. A semiconductor device according to claim 3, wherein Y is from about 0.15 to about 0.6 when the channel layer is made of GaN.

5. A semiconductor device according to claim 3, wherein Y is from about 0 to about 0.6 when the channel layer is made of InGaN.

6. A semiconductor device according to claim 2, wherein the InAlGaN second electron supply layer has a composition of $(In_xAl_{1-x})_yGa_{1-y}N$, where X is from about 0.3 to about 0.7, and $0 \leq Y \leq 1$.

7. A semiconductor device according to claim 6, wherein Y is from about 0.15 to about 0.6 when the channel layer is made of GaN.

8. A semiconductor device according to claim 6, wherein Y is from about 0 to about 0.6 when the channel layer is made of InGaN.

* * * * *